May 3, 1966 I. HOROWITZ 3,249,884
DIRECT-CURRENT-COUPLED ALTERNATING-CURRENT
TRANSISTOR AMPLIFIER
Filed June 14, 1962
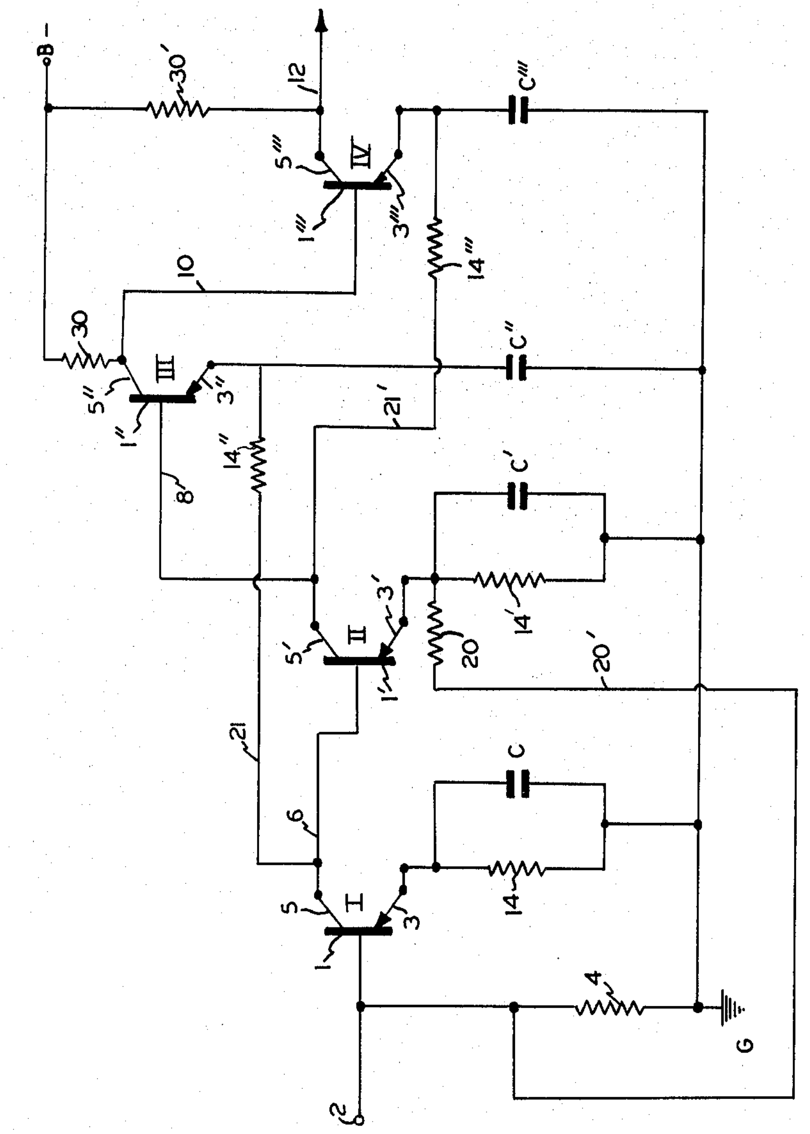
INVENTOR.
IRVING HOROWITZ
BY *Rines and Rines*
ATTORNEYS United States Patent Office 3,249,884

Patented May 3, 1966

3,249,884

DIRECT-CURRENT-COUPLED ALTERNATING-CURRENT TRANSISTOR AMPLIFIER

Irving Horowitz, Eatontown, N.J., assignor to Blonder-Tongue Electronics, Newark, N.J., a corporation of New Jersey Filed June 14, 1962, Ser. No. 202,533

2 Claims. (Cl. 330—19)

The present invention relates to alternating-current transistor amplifiers.

In order to attain good frequency response ranging from very low frequencies upward, in alternating-current transistor amplifier chains, large coupling capacitors between stages are required, as well as large emitter by-pass capacitors; say of the order of a few microfarads. Capacitors of this size require electrolytic construction, but the leakage of electrolytic capacitors is generally too large for effective coupling to the base electrodes of transistor amplifiers. Ceramic capacitors generally cannot be manufactured of high enough capacitance value for these purposes, and paper capacitors are inherently too large. While tantalitic capacitors may be employed, they are expensive and thus undesirable for low-cost circuitry.

Recourse may be had, therefore, to direct-current coupled alternating-current transistor amplifier chains, but such circuits have heretofore required large power supplies for the cascaded stages or expensive zener diode or similar coupling circuits. In addition, if an instability occurs in the input of the amplifier chain, it is amplified through the chain, and, indeed, may cause operation of the output transistor amplifier of the chain at a point removed from its desired operating condition.

An object of the present invention, accordingly, is to provide a new and improved direct-current-coupled transistor amplifier circuit for amplifying alternating-current signals, that obviates the disadvantages above discussed and, to the contrary, provides for economy of power supply with automatic compensation for any instabilities in the chain of amplifiers.

A further object is to provide a novel amplifier of more general utility, also.

Other and further objects will be explained hereinafter and will be more particularly pointed out in the appended claims. In summary, however, from one of its aspects, the invention contemplates particular degenerative feedback circuits and other multi-stage interconnecting circuits that enable the attainment of the novel results previously mentioned.

The invention will now be described in conection with the accompanying drawing, the single figure of which is a circuit diagram illustrating a preferred circuit embodying the invention.

The illustrated circuit employs four transistor amplifier stages I, II, III and IV (though more or less stages may clearly be employed), having respective base electrodes 1, 1', 1'' and 1'''; collector electrodes 5, 5', 5'' and 5'''; emitter electrodes 3, 3', 3'' and 3'''; emitter resistors 14, 14', 14'' and 14'''; and emitter-resistor by-pass capacitors C, C', C'' and C'''. The alternating-current input is applied at the terminal 2 to the base 1 of the first amplifier I, with the emitter resistor 14 and its by-pass capacitor C connected between the emitter 3 and the ground terminal G. The term "ground" as herein employed, is intended to connote not only actual earthing, but, also, chassis or other reference potential.

The output of the stage I is fed in a direct-current path from collector 5 by conductor 6 to the base 1' of the next succeeding amplifier II, and the emitter resistor 14' and its by-pass capacitor C' are connected between the emitter 3' and the ground terminal G. Similarly, the output from the collector 5' of the second amplifier stage II is fed by conductor 8 to the base 1'' of the next succeeding stage III; and the output from the collector 5'' of the third amplifier III is fed by conductor 10 directly to the base 1''' of the next succeeding amplifier IV. The final output of the amplifier chain is fed along conductor 12 from the collector 5''' of the amplifier stage IV.

In accordance with the invention, a degenerative feedback circuit is connected between the emitter electrode of each of the amplifiers II, III and IV, following the first amplifier I, and the base of the immediately preceding amplifier. Thus, for example, the degenerative feedback circuit 20–20' is connected from the emitter 3' of the second amplifier II to the base 1 of the immediately preceding amplifier I, which is returned to ground G through the input resistance 4. The similar respective feedback circuits 14''–21 (including the emitter resistor 14'') and 14'''–21' (including the emitter resistor 14''') are also connected from the respective emitters 3'' and 3''' of the III and IV stages, to the respective preceding-stage base electrodes 1' and 1'' of amplifiers II and III.

Lastly, for the practice of the invention, the emitter electrode of each of the amplifiers III and IV succeeding the second amplifier II, is inter-connected with the collector electrode of the respective amplifiers I and II preceding the immediately preceding respective amplifiers II and III, in order to provide common collector current in alternate amplifiers of the chain and thus to provide automatic compensation for instabilities and to enable simple common power supply requirements. Thus, the emitter electrode 3'' of the amplifier III is connected by the path 14''–21 and conductor 6 also to the collector electrode 5 of the amplifier I preceding the amplifier II; the amplifier II immediately preceding the amplifier III. Similarly, it is the collector electrode 5' of the amplifier II preceding the amplifier III that immediately precedes amplifier IV, that is connected by conductor 21' through resistor 14''' to the emitter electrode 3''' of the amplifier IV.

The collector current of alternate amplifiers is thus maintained the same with the circuits direct-current coupled and interlocked. The collectors 5'' and 5''' are connected through respective loads 30 and 30' to the B-power supply terminal. Compensation for instabilities before-discussed, and economy of power source is thereby attained.

A typical circuit of the type shown in the drawing that has been found admirably to accomplish these ends employed PADT28-type transistors and the following component values:

Resistors:

| | | |
|---|---|---|
| 14 | ohms | 1K |
| 14' | do | 4.7K |
| 14'' | do | 3.3K |
| 14''' | do | 3.3K |
| 4 | do | 6.8K |
| 20 | do | 22K |
| 30 | do | 10K |
| 30' | do | 1.5K |
| Capacitors: C, C', C'', C''' | μfd | 100 |
| B— | volts | 20 |

It is to be noted that the total resistance of the voltage divider feedback resistors 20 and 4 in series is substantially greater than the resistance of the emitter load resistor 14' of stage II and that the resistance of resistor 20 is substantially greater than the individual resistances of resistors 4 and 14'.

As before stated, more or less transistor stages may be employed, connected to satisfy the above requirements; and further modifications will also occur to those skilled in the art, being considered to fall within the scope and spirit of the invention as defined in the appended claims.

What is claimed is:

1. In a transistor amplifier arrangement having an input and an output and at least three stages, each including one transistor, in combination, means for coupling the input with the base of the transistor of the first stage; means for coupling the output with the collector of the transistor of the final stage; a source of direct current supply having a first and a second terminal; means for directly coupling the collector of the transistor of each stage to the base of the transistor of the next following stage, respectively; means for connecting the emitter of the transistor of said first stage to said first terminal of said source; a resistive voltage divided network including first and second resistors connected consecutively in series between the emitter of the transistor of said second stage and said first terminal of said source, the junction point between said resistors being connected with the base of said transistor of said first stage; a third resistor connected between the emitter of said transistor of the second stage and said first terminal of said source, the total resistance of said first and second resistors in series being substantially greater than the resistance of said third resistor; a plurality of resistance means respectively coupling directly the collector of the transistor of the individual stages to the emitter of the transistor of the respectively second following stage; a fourth resistor connected between said second terminal of said source and the collector of said transistor of said final stage; and a fifth resistor connected between said second terminal of said source and the base of said transistor of said final stage.

2. In the amplifier arrangement of claim 1, said first resistor having a resistance substantially greater than the individual resistances of said second and said third resistors.

References Cited by the Examiner

UNITED STATES PATENTS

| | | | |
|---|---|---|---|
| 3,040,264 | 6/1962 | Weidner | 330—19 X |
| 3,168,706 | 2/1965 | Brenig | 330—19 X |

FOREIGN PATENTS

| | | |
|---|---|---|
| 1,268,809 | 6/1961 | France. |

ROY LAKE, *Primary Examiner.*

NATHAN KAUFMAN, *Examiner.*

F. D. PARIS, *Assistant Examiner.*